United States Patent
Aochi et al.

(10) Patent No.: US 7,791,060 B2
(45) Date of Patent: Sep. 7, 2010

(54) SEMICONDUCTOR MEMORY DEVICE AND METHOD OF CONTROLLING THE SAME

(75) Inventors: Hideaki Aochi, Kanagawa-ken (JP); Yoshiaki Fukuzumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 11/905,050

(22) Filed: Sep. 27, 2007

(65) Prior Publication Data

US 2008/0089121 A1   Apr. 17, 2008

(30) Foreign Application Priority Data

Sep. 27, 2006   (JP) .............................. 2006-263308

(51) Int. Cl.
    *H01L 29/06*   (2006.01)
(52) U.S. Cl. ............... 257/5; 257/42; 257/E45.002; 257/E27.006; 257/E45.003; 365/148; 365/163
(58) Field of Classification Search ............... 257/5, 257/42, E45.002, E27.006, E45.003; 365/148, 365/163
See application file for complete search history.

(56) References Cited

U.S. PATENT DOCUMENTS

| | | | |
|---|---|---|---|
| 3,753,110 A | 8/1973 | Ikeda et al. | |
| 2004/0124407 A1* | 7/2004 | Kozicki et al. | ............ 257/9 |
| 2005/0226036 A1* | 10/2005 | Aratani et al. | ............ 365/158 |
| 2006/0094154 A1 | 5/2006 | Lung | |
| 2006/0151771 A1 | 7/2006 | Asano et al. | |
| 2006/0157683 A1 | 7/2006 | Scheuerlein | |
| 2006/0157802 A1* | 7/2006 | Sakamoto et al. | ........... 257/393 |
| 2007/0090354 A1* | 4/2007 | Campbell | ............ 257/42 |
| 2008/0043520 A1* | 2/2008 | Chen | ............ 365/163 |

FOREIGN PATENT DOCUMENTS

| | | |
|---|---|---|
| CN | 1650444 A | 8/2005 |
| CN | 1759450 A | 4/2006 |
| JP | 2006-505939 | 2/2006 |
| WO | WO 03/028124 A1 | 4/2003 |
| WO | WO 03/079463 A2 | 9/2003 |
| WO | WO 2004/042738 A1 | 5/2004 |
| WO | WO 2004/084229 A1 | 9/2004 |

OTHER PUBLICATIONS

Notification of the First Office Action issued by the Chinese Patent Office on Apr. 3, 2009, for Chinese Patent Application No. 200710161603, and English-language translation thereof.

\* cited by examiner

*Primary Examiner*—Tu-Tu V Ho
(74) *Attorney, Agent, or Firm*—Finnegan, Henderson, Farabow, Garrett & Dunner, L.L.P.

(57) ABSTRACT

A semiconductor memory device comprising: first and second wirings arranged in a matrix; and a memory cell being provided at an intersecting point of the first and second wirings and including a resistance change element and an ion conductor element connected to each other in a cascade arrangement between the first and second wirings.

7 Claims, 8 Drawing Sheets

SEMICONDUCTOR MEMORY DEVICE AND METHOD OF CONTROLLING THE SAME

CROSS-REFERENCE TO RELATED APPLICATION

This application is based upon and claims the benefit of priority from the prior Japanese Patent Application No. 2006-263308, filed on Sep. 27, 2006, the entire contents of which are incorporated herein by reference.

BACKGROUND OF THE INVENTION

1. Field of the Invention

The present invention relates to a semiconductor memory device and method of controlling the semiconductor memory device.

2. Description of the Related Art

In recent years, as the next generation semiconductor memory device, the following devices have been developed; a ferroelectric random access memory (FeRAM), a magnetic random access memory (MRAM), a phase change random access memory (PRAM), a resistive random access memory (RRAM), an ovonic unified memory (OUM) and the like. The RRAM and OUM are semiconductor memory devices using diode characteristics. As a type of diode used in the RRAM or OUM, a pn diode formed on a semiconductor substrate such as a silicon substrate is used (refer to Japanese Patent Translation Publication No. 2006-505939 (pp. 26, FIG. 1) and International Publication WO2003/028124).

In the diode described in Japanese Patent Translation Publication 2006-505939, the operation of the diode requires an application of a voltage equivalent to the forward voltage (Vf) of the pn diode, for example, a voltage not less than 0.7 V. For this reason, there is a problem that it is difficult to perform an operation at a low voltage not greater than Vf in the semiconductor memory device using the diode characteristics. Moreover, a silicon pn diode requires a heat treatment at a temperature substantially not less than 750° C. in order to activate the P layer or the N layer. For this reason, there is another problem that it is difficult to manufacture, at a relatively low temperature, a semiconductor memory device using the diode characteristics.

SUMMARY OF THE INVENTION

According to an aspect of the present invention, there is provided a semiconductor memory device comprising:

first and second wirings arranged in a matrix; and a memory cell being provided at an intersecting point of the first and second wirings and including a resistance change element and an ion conductor element connected to each other in a cascade arrangement between the first and second wirings.

According to another aspect of the present invention, there is provided a semiconductor memory device comprising:

bit lines and word lines arranged in a matrix; and a memory cell being provided at an intersecting point of one of the bit lines and one of the word lines and including a resistance change element and an ion conductor element connected to each other in a cascade arrangement between the bit line and the word line, wherein, the ion conductor element is formed of a first electrode film, an ion conductor film and a second electrode film in a superposed manner, and the resistance change element is formed of the second electrode film, a resistance change film and a third electrode film in a superposed manner.

According to another aspect of the present invention, there is provided a semiconductor memory device comprising:

bit lines and word lines arranged in a matrix; and a memory cell being provided at an intersecting point of one of the bit lines and one of the word lines and including a resistance change element and an ion conductor element connected to each other in a cascade arrangement between the bit line and the word line, wherein, the ion conductor element is formed of a first electrode film, an ion conductor film and a second electrode film in a superposed manner, and the resistance change element is formed of the second electrode film, a phase change film and a third electrode film in a superposed manner.

According to another aspect of the present invention, there is provided a method of controlling a semiconductor memory device including first and second memory cells each having a resistance change element and an ion conductor element which are connected to each other in a cascade arrangement between a bit line and a word line, the method comprising the steps of:

causing the first and second memory cells to be in an initialization state by setting the bit line to an off voltage, and by setting the word line to a ground potential;

causing the first and second memory cells to be in a standby state by setting each of the bit line and the word line to a standby voltage;

causing the second memory cell to be in an off state by setting the bit line of the second memory cell to one of a set voltage, a reset voltage and a readout voltage and by setting the word line of the second memory cell to the ground potential;

setting the first memory cell to be in a set state with a current flowing through the ion conductor element of the first memory cell, the current caused to flow by setting the word line of the first memory cell to the set voltage and by setting the bit line of the first memory cell to the ground potential;

setting the first memory cell to be in a reset state with a current flowing through the ion conductor element of the first memory cell, the current caused to flow by setting the word line of the first memory cell to the reset voltage and by setting the bit line of the first memory cell to the ground potential;

reading out information stored in the resistance change element of the first memory cell with a current flowing through the ion conductor element of the first memory cell, the current caused to flow by setting the word line of the first memory cell to the read out voltage, and by setting the bit line of the first memory cell to the ground potential; and setting the bit line of the first memory cell to the off voltage and setting the word line of the first memory cell to the ground potential after an operation of the first memory cell ends.

DETAILED DESCRIPTION OF THE INVENTION

Hereinafter, descriptions will be given of embodiments of the present invention with reference to the accompanying drawings.

First Embodiment

Figure 1:
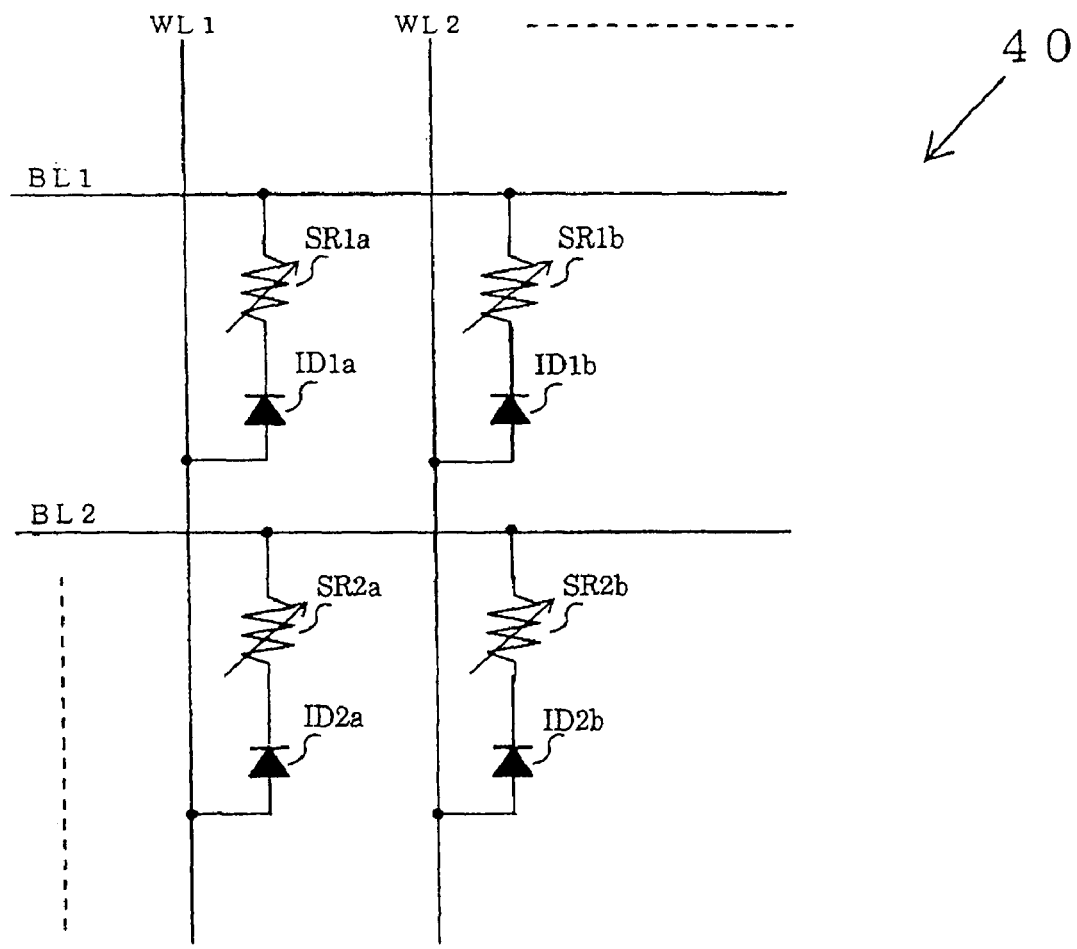
FIG. 1 is a circuit diagram showing a memory cell according to a first embodiment of the present invention.
Figure 2:
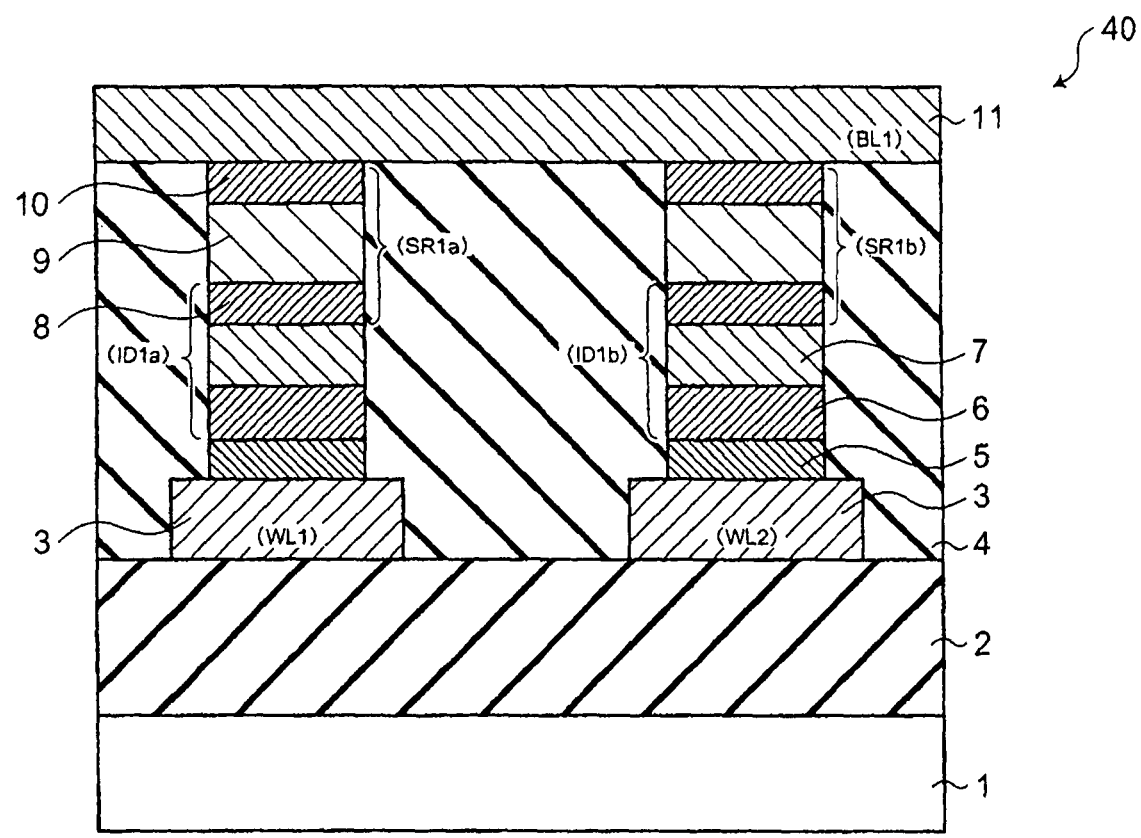
FIG. 2 is a cross sectional view showing the memory cell according to the first embodiment of the present invention.
Figure 3:
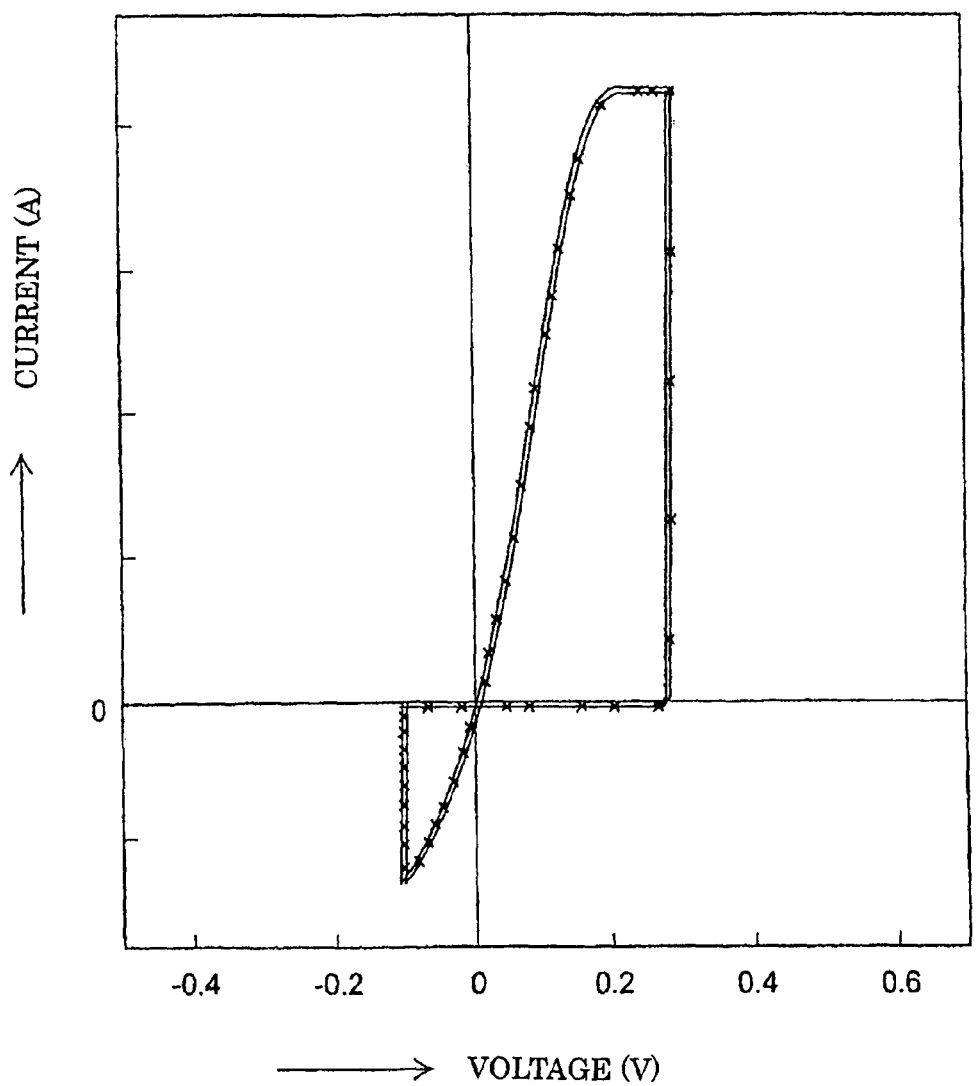
FIG. 3 is a diagram showing the current voltage characteristics of an ion conductor element according to the first embodiment of the present invention.

First, descriptions will be given of a semiconductor memory device and a method of controlling the same according to a first embodiment of the present invention with reference to the drawings. FIG. 1 is a circuit diagram showing a memory cell. FIG. 2 is a cross sectional view of the memory cell. FIG. 3 is a diagram showing the current voltage characteristics of an ion conductor element. In this embodiment, the memory cell is configured of the ion conductor element and a phase change element.

As shown in FIG. 1, bit lines BL as first wirings and word lines WL as second wirings are arranged in a matrix in a memory cell 40. An ion conductor element functioning as a diode, and a phase change element that is a resistance element are connected in a cascade arrangement between the bit lines BL and the word lines WL at a portion where each of the bit lines BL and the word lines WL intersects with one another.

One end of the phase change element is connected to the bit line BL and the other end of the phase change element is connected to the cathode of the ion conductor element functioning as a diode. The anode of the ion conductor element functioning as a diode is connected to the word line WL. For example, a phase change element SR1$a$ and an ion conductor element ID1$a$ are connected between a bit line BL1 and a word line WL1; a phase change element SR1$b$ and an ion conductor element ID1$b$ are connected between the bit line BL1 and a word line WL2; a phase change element SR2$a$ and an ion conductor element ID2$a$ are connected between a bit line BL2 and the word line WL2; a phase change element SR2$b$ and an ion conductor element ID2$b$ are connected between the bit line BL2 and the word line WL2; each of which are connected in a cascade arrangement.

As shown in FIG. 2, the memory cell 40 includes an electrode film 5, an electrode film 6, an ion conductor film 7, an electrode film 8, a phase change film 9 and an electrode film 10, which are formed in a laminated manner, sandwiched between wiring layers 3 that are the word lines WL and a wiring layer 11 that is the bit line BL. The wiring layers 3 are provided above a semiconductor substrate 1 with an insulating film 2 interposed therebetween. Moreover, an interlayer insulating film 4 is formed between the memory cells. Here, the ion conductor element ID1$a$ is provided above the wiring layer 3 that is the word line WL1. The ion conductor element ID1$a$ is formed of the electrode film 6 serving as the lower electrode film, the ion conductor film 7, and the electrode film 8 serving as the upper electrode film, in a superposed manner. In addition, the phase change element SR1$a$ is provided in the memory cell 40, the element being formed of the electrode film 8 serving as the lower electrode film in this case, the phase change film 9, and the electrode film 10 serving as the upper electrode film, in a superposed manner. The ion conductor element ID1$b$ is provided above a different wiring layer 3 that is the word line WL2, the element being formed of a different electrode film 6 serving as the lower electrode film, a different ion conductor film 7 and a different electrode film 8 serving as the upper electrode film, in a superposed manner. Moreover, the phase change element SR1$b$ is provided in the memory cell 40, the element being formed of the different electrode 8 serving as the lower electrode film in this case, a different phase change film 9 and a different electrode film 10 serving as the upper electrode film, in a superposed manner.

Here, silver sulfide ($Ag_2S$)/silver (Ag) are used as the materials of the ion conductor film 7/the electrode film 6 which partially constitute the ion conductor element. However, metal sulfide/metal such as copper sulfide/copper, chromium sulfide/chromium, titanium sulfide/titanium, or tungsten sulfide/tungsten may be used. Such metal sulfides are termed as ion conductive solid electrolytes.

In this embodiment, GeSbTe chalcogenide (GST) is used as the material of the phase change element of the phase change film 9 as a resistance change element. However, AsSbTe or SeSbTe, or an admixture in which oxygen, nitrogen or silicon added in one of these may be used. Moreover, as the materials of electrode film 5, electrode film 8 and electrode film 10, tantalum (Ta), platinum (Pt) and nitride titanium (TiN) are respectively used, here, for example.

As shown in FIG. 3, the ion conductor element operates in the following way at the time of the application of a low voltage. When the voltage applied between the upper electrode film and the lower electrode film is set to a relatively low negative voltage, for example, −0.1 V, a current flows through the ion conductor element. At this time, silver ions of the electrode film 6 start to move and then, sliver (Ag) is precipitated on the interface of the electrode film 8 serving as the upper electrode and the ion conductor film 7. When the voltage is changed from a relatively low negative voltage to a relatively low positive voltage, for example, up to +0.2 V, a current flows substantially linearly through the ion conductor element (a negative current flows through the negative side and a positive current flows through the positive side). With a relatively high positive voltage, for example, 0.2 V, the current flowing through the ion conductor element saturates. The silver (Ag) precipitated on the interface between the electrode film 8 serving as the upper electrode and the ion conductor film 7 saturates as well.

Next, when the voltage applied between the upper electrode film and the lower electrode film is set to a relatively high positive voltage, for example, +0.3 V, the current does not flow through the ion conductor element (the silver (Ag) precipitated on the interface between the electrode film 8 serving as the upper electrode and the ion conductor film 7 moves to the electrode film 6). When the voltage is changed from a relatively low positive voltage to a relatively low negative voltage, the current does not flow through the ion conductor element either. When the voltage applied between the upper electrode film and the lower electrode film is set to −0.1 V, the current begins to flow through the ion conductor element again.

As has been described above, the ion conductor element can perform a diode operation without a forward voltage (Vf), which is different from a silicon pn diode, for example. Specifically, when a relatively low negative voltage is applied to the electrode film 8 serving as the upper electrode, a current flows (forward direction). The resistance value at that time is an extremely small value such as substantially 50Ω or the like even in a case where the area of the electrode film and the ion conductor film is 50 nmØ, for example. When a relatively low positive voltage is applied to the electrode film 8 serving as the upper electrode, the current does not flow (reverse direction).

The description has been given of an operation at a low voltage. However, when a relatively high negative voltage, for example, −2 V is applied to the electrode film 8 serving as the upper electrode, a relatively large current flows. In addition, when a relatively high positive voltage, for example, +2 V is applied to the electrode film 8 serving as the upper electrode, a current does not flow. Incidentally, it should be noted that the electrode film 8 can be omitted. In this case, the metal precipitated from the iconic conductor film functions as the lower electrode film of the phase change film 9.

Figure 4:
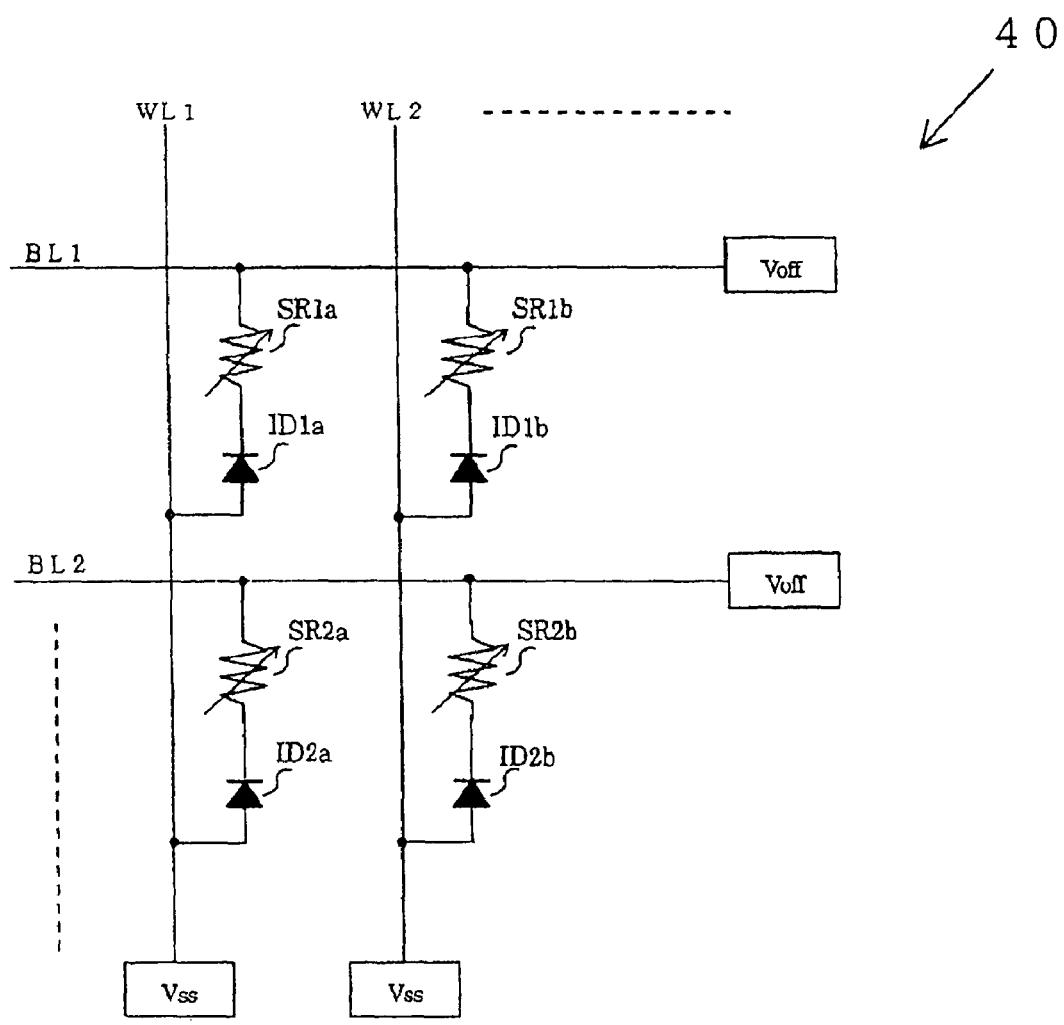
FIG. 4 is a diagram showing an operation of the memory cell according to the first embodiment of the present invention.
Figure 5:
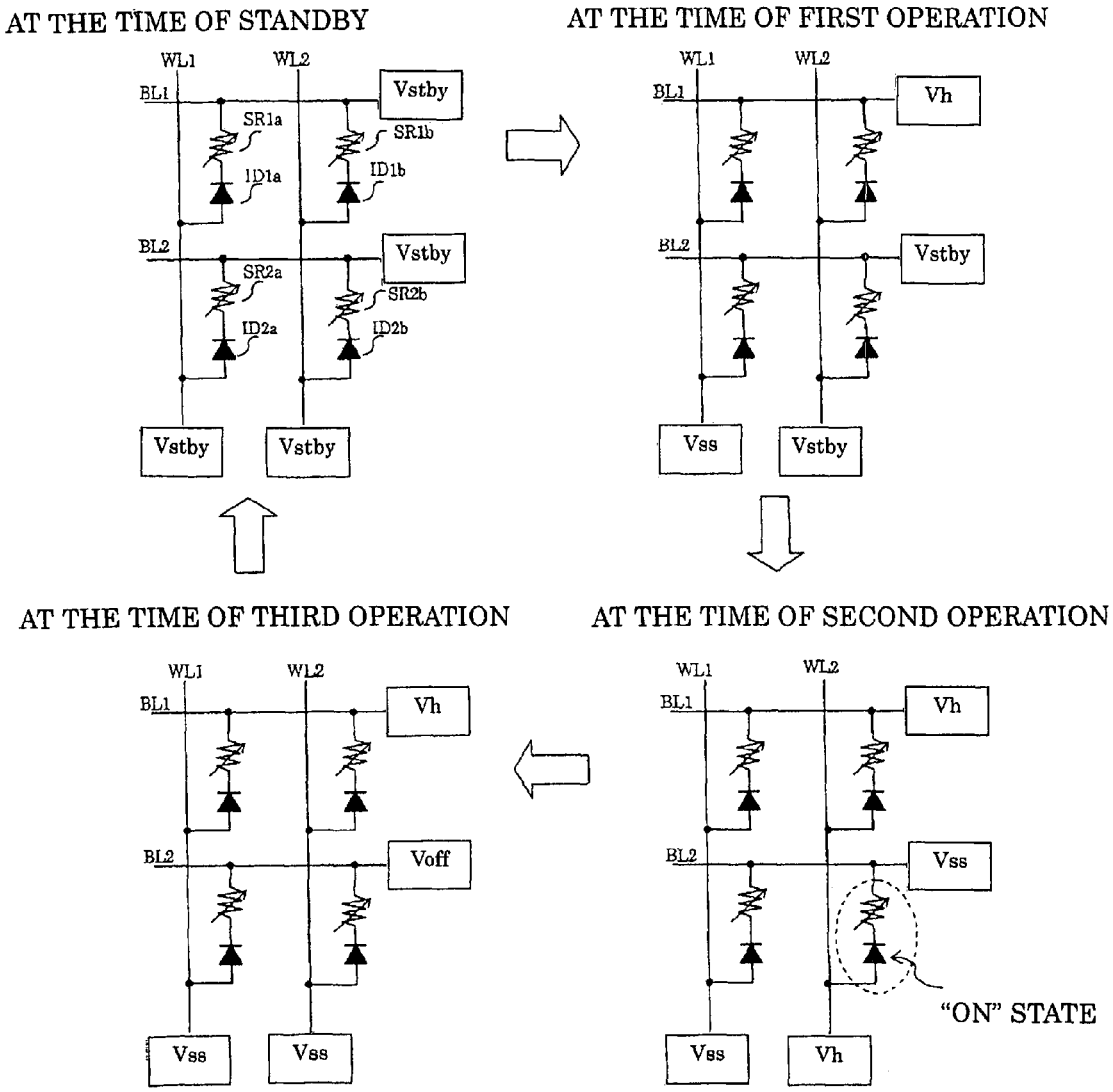
FIG. 5 is another diagram showing operations of the memory cell according to the first embodiment of the present invention.
Figure 6:
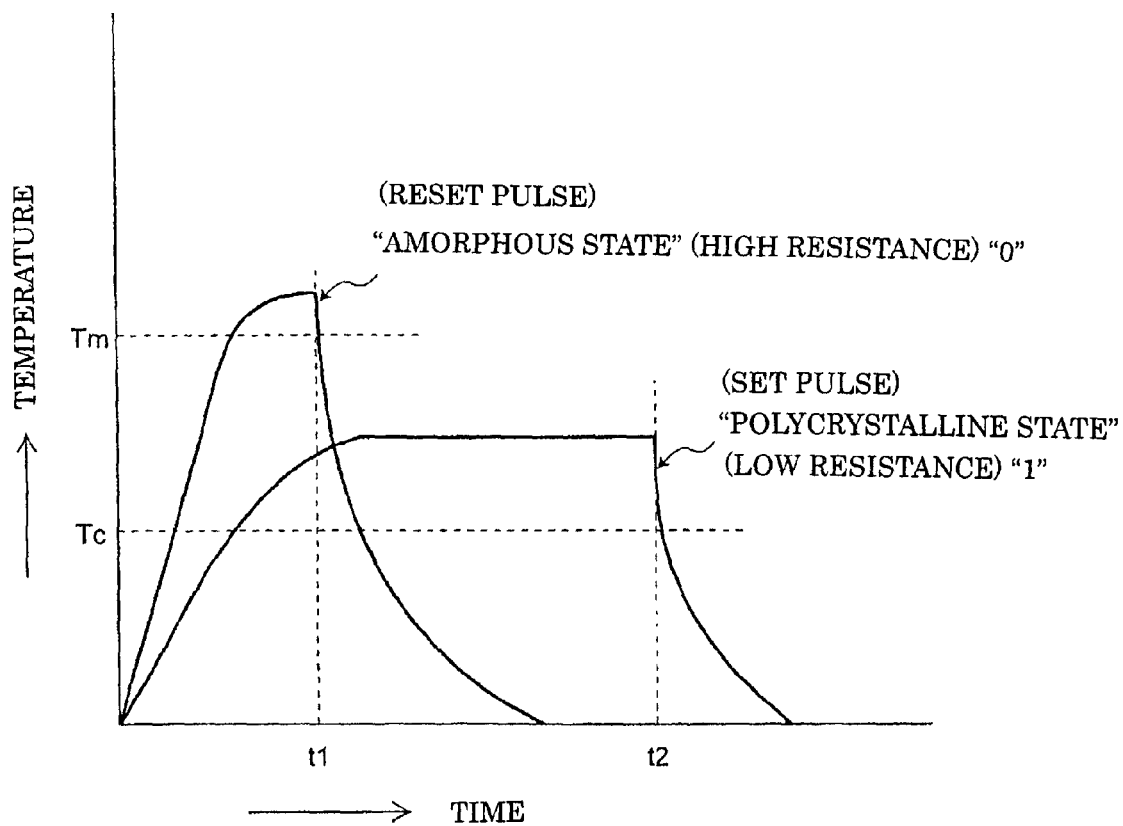
FIG. 6 is a diagram provided for describing setting and resetting operations of a phase change element according to the first embodiment of the present invention.

Next, a description will be given of operations of the memory cell with reference to FIGS. 4 to 6. FIG. 4 is a diagram showing an operation of the memory cell. FIG. 5 is another diagram showing operations of the memory cell. FIG. 6 is a diagram provided for describing setting and resetting operations of the phase change element.

As shown in FIG. 4, in the memory cell at the time of initialization, the bit lines BL1 and BL2 are set to off voltage (Voff), and the word lines W1 and W2 are set to a low voltage side supply voltage (Vss), which is the ground potential. When Vss<Voff, in a case where the silver (Ag) is precipitated on the interface between the electrode film 8 serving as the upper electrode and the ion conductor film 7, the precipitated silver (Ag) moves to the electrode film 6 serving as the lower electrode. In a case where silver (Ag) is not precipitated, there is no change.

As shown in FIG. 5, in the memory cell at the time of standby, the bit lines BL1 and BL2 and the word lines W1 and W2 are set to a standby voltage Vstby that is a higher voltage than the low voltage side supply voltage Vss.

Next, in the memory cell at the time of a first operation, a bit line not connected to a predetermined memory cell (here, the memory cell connected to the bit line BL2 and the word line WL2) is set to a high voltage Vh, and the word line is set to a low voltage side supply voltage (the ground potential) Vss. This high voltage Vh can be set to any one of a set voltage Vset, a reset voltage Vreset and a readout voltage Vread. It should be noted that the voltages set for the bit line and word line connected to the operated memory cell are not changed until a third operation.

Subsequently, in the memory cell at the time of a second operation, the bit line BL2 and the word line WL2 are set to the low voltage side supply voltage Vss and the high voltage Vh, respectively. Thereby, a current flows through the ion conductor element ID2$b$, and then the memory cell becomes an ON state. Here, when the high voltage Vh is set to the set voltage Vset, the memory cell becomes a set state. When the high voltage Vh is set to the reset voltage Vreset, the memory cell becomes a reset state. Furthermore, when the high voltage Vh is set to the set voltage Vread, information in the memory cell can be read. The relationship of the reset voltage Vreset, the set voltage Vset and the read out voltage Vread, and the relationship of the low voltage side supply voltage Vss, the standby voltage Vstby and the readout voltage Vread are set as follows:

$$Vreset \geqq Vset \geqq Vread$$

$$Vss < Vstby < Vread$$

In a case where the phase change element SR2$b$, which is a memory element, is changed from a polycrystalline state that is a state of a low resistance "1," to an amorphous state that is a state of a high resistance "0" (reset operation), a reset pulse signal during a time t1 of less than ins, for example, is applied to the phase change element SR2$b$. Then, by causing a relatively large current (reset current) to flow through the phase change element SR2$b$, the temperature of the phase change element SR2$b$ is increased to equal to or greater than a melting point (Tm) so that the phase change element SR2$b$ is rapidly cooled down.

On the other hand, in a case where the phase change element SR2$b$ is changed from the amorphous state that is the state of a high resistance "0" to the polycrystalline state that is the state of a low resistance "1" (set operation), a reset pulse signal during a time t2 of not less than 10 ns, for example, is applied to the phase change element SR2$b$. Then, by causing a relatively small current (set current) to flow through the phase change element SR2$b$, the temperature of the phase change element SR2$b$ is kept not higher than a melting point and not lower than the crystallization temperature (TC) for a predetermined period of time.

The information on the memory cell (information of whether the phase change element SR2$b$ is "1" or "0") can be obtained by setting the word line WL2 to the readout voltage Vread in a state where the ion conductor element ID2$b$ is "ON."

Then, in the memory cell at the time of a third operation, the bit line BL2 and the word line WL2 are set to the off voltage Voff and the low voltage side supply voltage Vss, respectively. Thereby, in a case where the silver (Ag) is precipitated on the interface between the electrode film 8 serving as the upper electrode of the ion conductor element and the ion conductor film 7, the precipitated silver (Ag) moves to the electrode film 6 serving as the lower electrode. After the third operation is set, the memory cell returns to the standby state.

Here, by setting the third operation to the memory cell, the ion conductor element is allowed to return to the "OFF" state. For this reason, in a case of accessing to the next bit, leak current can be reduced, and the memory cell can thus become a low current consumption type.

As described above, in the semiconductor memory device and the method of controlling the same according to the present embodiment, provided is the memory cell 40 in which the phase change element that is a resistance change element and the ion conductor element operating as a diode, are provided in a cascade arrangement between the bit line BL and the word line WL. The ion conductor element is configured of the electrode film 6 serving as the lower electrode, the ion conductor film 7 and the electrode film 8 serving as the upper electrode. The phase change element is configured of the electrode film 8 serving as the lower electrode, the phase change film 9 and the electrode film 10 serving as the upper electrode. The ion conductor element becomes an "ON" state (the resistance value at this time is very small) when a current is caused to flow through the ion conductor element by the application of a voltage lower than the forward voltage (Vf) of the silicon pn diode, for example, −0.1 V, to the electrode film 8 serving as the upper electrode. Meanwhile, the ion conductor element becomes an "OFF" state when a current is not caused to flow through the ion conductor element by the application of a positive voltage to the electrode film 8 serving as the upper electrode. The state, "0," in which the resistance of the phase change element is high, can be set by causing the ion conductor element to become the "ON" state and then by applying the reset voltage Vreset that is a reset pulse signal to the word line WL. The state, "1," in which the resistance of the phase change element is low, can be set by causing the ion conductor element to become the "ON" state and then by applying the set voltage Vset that is a set pulse signal to the word line WL.

For this reason, in comparison with the conventional semiconductor memory device using diode characteristics, the semiconductor memory device according to the present embodiment can operate at a low voltage. Moreover, since the semiconductor memory device according to the present embodiment does not use a silicon pn diode, the heat treatment of substantially not less than 750° C. for activating the P layer or the N layer is no longer required. Thus, the semiconductor memory device using diode characteristics can be manufactured at a relatively low temperature.

It should be noted that although a sulfide silver ($Ag_2S$) is used as the material of the ion conductor film 7 in the present embodiment, any of the following may also be used as the material of the ion conductor film 7: ion conductive solid electrolyte such as silver iodide; stabilized zirconia; 3d or 4d transition metal chalcogenide (i.e., S, Se or Te) or halogenide (F, Cl, Br, I); or 3d or 4d transition metal oxide (i.e., $WO_3$, $TiO_2$ or $SrTiO_2$) to which a dissimilar metal element (Na, Ag, Cu) is added.

Moreover, the combination of two ion conductor films whose electrical conductivity differ from each other and both of which contain same mobile ion may be used instead of the combination of the ion conductor film 7/the electrode film 6. In this case, the copper iodide (CuI) film may be used instead of the ion conductor film 7 and the copper (II) sulphide (CuS) film may be used instead of the electrode film 6. When it does in this way, the copper precipitated on the interface between the CuI film and CuS film at the "ON" state promptly diffuse in the CuS film at the "OFF" state. Therefore, it can reduce the Dendrite growth of the copper which causes a short circuit of the ion conductor element in case of using the copper film as the electrode film 6.

Second Embodiment

Figure 7:
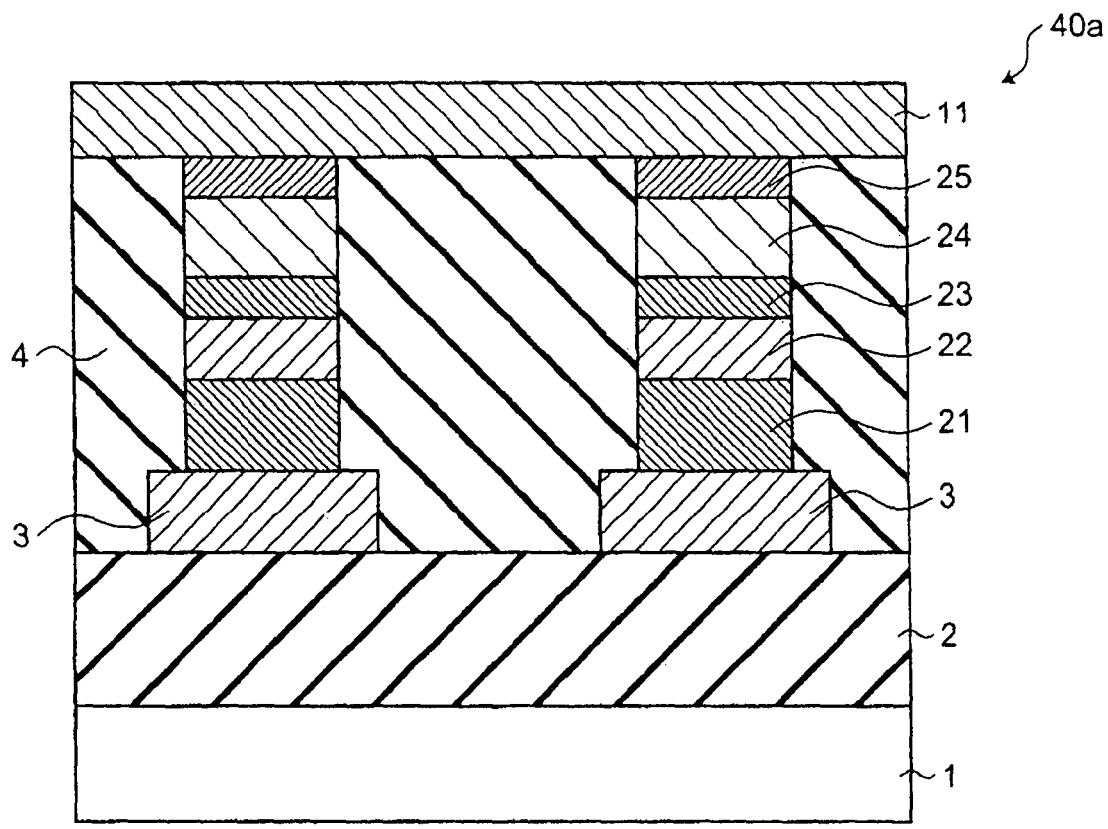
FIG. 7 is a cross sectional view showing a memory cell according to a second embodiment of the present invention.

Next, a description will be given of a semiconductor memory device according to a second embodiment of the present invention with reference to the drawings. FIG. 7 is a cross sectional view of a memory cell. In this embodiment, the memory cell is configured of an ion conductor element and a resistance change element.

As shown in FIG. 7, a memory cell 40a includes an electrode film 21, an ion conductor film 22, an electrode film 23, a transition metal oxide film 24 and an electrode film 25, in a superposed manner sandwiched between a wiring layer 3 that is a word line WL and a wiring layer 11 that is a bit line BL. The wiring layers 3 and 11 are provided above a semiconductor substrate 1 with an insulating film 2 interposed therebetween. Moreover, an interlayer insulating film 4 is formed between the memory cells. Here, an ion conductor element is provided above the wiring layer 3. The ion conductor element is formed of the electrode film 21 serving as the lower electrode film, the ion conductor film 22 and the electrode film 23 serving as the upper electrode film, in a superposed manner. In addition, a resistance change element is provided in the memory cell 40, the element being formed of the electrode film 23 serving as the lower electrode film in this case, the transition metal oxide film 24 as a resistance change film and the electrode film 25 serving as the upper electrode film, in a superposed manner.

Here, copper sulfide ($Cu_2S$)/copper (Cu) are used as the materials of the ion conductor film 22/the electrode film 21, which constitute the ion conductor element. In addition, nickel oxide (NiO binary system transition metal oxide film) is used as the material of the transition metal oxide film 24 serving as the resistance change film. However, binary system transition metal oxide such as niobium oxide, copper oxide, hafnium oxide or zirconium oxide may be used. Moreover, a lamination film of these may be used.

Here, nitride titanium aluminum (TiAlN) is used as the material of the electrode films 23 and 25, for example. However, nitride titanium silicon, nitride tantalum aluminum, nitride tantalum silicon or the like may be used.

A reset pulse voltage is applied to the resistance change element serving as a memory element when a state in which the resistance value of the transition metal oxide film 24 is low ("1" which is "ON") is switched to a state in which the resistance value of the transition metal oxide film 24 is high ("0" which is "OFF"). In addition, a set pulse voltage is applied to the resistance change element when a state in which the resistance value of the transition metal oxide film 24 is high ("0" which is "OFF") is switched to a state in which the resistance value of the transition metal oxide film 24 is low ("1" which is "ON").

As described above, in the semiconductor memory device according to the present embodiment, provided is the memory cell 40a in which the resistance change element and the ion conductor element operating as a diode are provided in a cascade arrangement between the bit line BL and the word line WL. The ion conductor element is configured of the electrode film 21 serving as the lower electrode, the ion conductor film 22 and the electrode film 23 serving as the upper electrode. The resistance change element is configured of the electrode film 23 serving as the lower electrode, the transition metal oxide film 24 serving as the resistance change film and the electrode film 25 serving as the upper electrode. The ion conductor element becomes an "ON" state (the resistance value at this time is very small) when a current is caused to flow through the ion conductor element by the application of a voltage lower than the forward voltage (Vf) of the silicon pn diode, for example, −0.1 V, to the electrode film 23 serving as the upper electrode. The ion conductor element becomes an "OFF" state when a current is not caused to flow through the ion conductor element by the application of a positive voltage to the electrode film 23 serving as the upper electrode. The state, "0," in which the resistance of the resistance change element is high can be set by causing the ion conductor element to become the "ON" state and then by applying the reset voltage Vreset to the word line WL. The state, "1," in which the resistance of the resistance change element is low can be set by causing the ion conductor element to become the "ON" state and then by applying the set voltage Vset to the word line WL.

For this reason, in comparison with the conventional semiconductor memory device using diode characteristics, the semiconductor memory device according to the present embodiment can operate at a low voltage. Moreover, since the semiconductor memory device according to the present embodiment does not use a silicon pn diode, the heat treatment of substantially not less than 750° C. for activating the P layer or the N layer is no longer required. Thus, a semiconductor memory device using diode characteristics can be manufactured at a relatively low temperature.

In this embodiment, the transition metal oxide film 24 of binary system is used as the resistance change film of the resistance change element. However, perovskite-type oxide in which transition metal is doped may be used. In addition, the electrode film 23 may be omitted. In this case, the metal precipitated from the ion conductor film functions as the lower electrode of the resistance change film 24.

Third Embodiment

Figure 8:
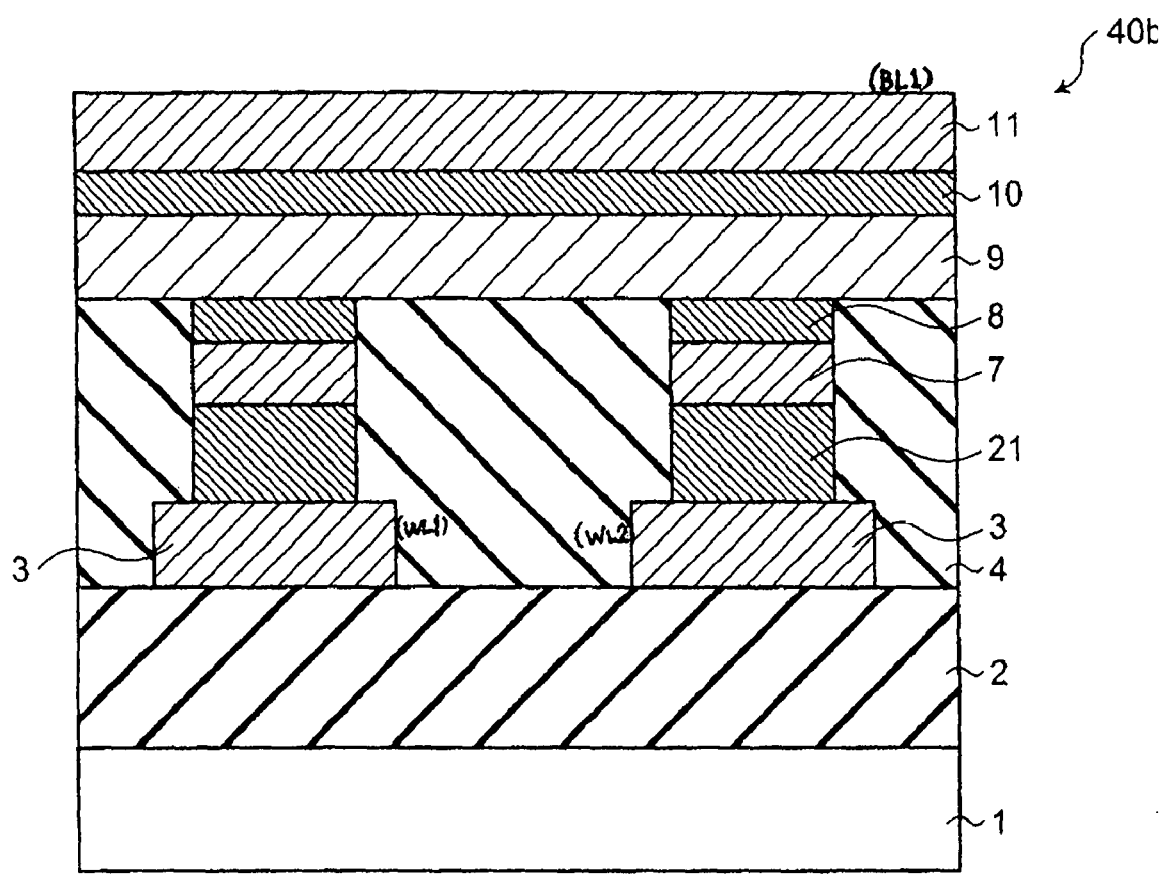
FIG. 8 is a cross sectional view showing a memory cell according to a third embodiment of the present invention.

Next, a description will be given of a semiconductor memory device according to a third embodiment of the present invention with reference to the drawing. FIG. 8 is a cross sectional view of a memory cell. In this embodiment, the structure of the memory cell is changed.

Hereinafter, the same reference numerals are used to denote components that are the same as those in the first embodiment and the descriptions of the components are omitted, and only different components will be described.

As shown in FIG. 8, a memory cell 40b is formed of an electrode film 21, an ion conductor film 7 and an electrode film 8, in a superposed manner sandwiched between a wiring layer 3 that is a word line WL and a phase change film 9. The wiring layer 3 is provided above a semiconductor substrate 1 with an insulating film 2 interposed therebetween. In addition, an interlayer insulating film 4 is formed between ion conductor elements. Moreover, an electrode film 10 and a wiring layer 11 that is a bit line BL1 are formed above the phase change film 9.

Here, a first ion conductor element formed of the electrode film 21 serving as the lower electrode film, the ion conductor film 7 and the electrode film 8 serving as the upper electrode in a superposed manner is provided on the wiring layer 3 that is a word line WL1. A second ion conductor element formed of a different electrode film 21 serving as the lower electrode film, a different ion conductor film 7 and a different electrode film 8 serving as the upper electrode in a superposed manner is provided on a different wiring layer 3 that is a word line WL2. In addition, a phase change element formed of the electrode films 8 each serving as the lower electrode film, the phase change film 9 and the electrode film 10 serving as the upper electrode in a superposed manner is provided in the memory cell 40b. It should be noted that the electrode films 8 may be omitted. In this case, the metal precipitated from the ion conductor films functions as the lower electrodes of the phase change film 9.

As described above, in the semiconductor memory device according to the present embodiment, provided is the memory cell 40b in which the phase change element serving as a resistance change element and the ion conductor element operating as a diode are connected in a cascade arrangement between the bit line BL and the word line WL. Each of the ion conductor elements is configured of the electrode film 21 serving as the lower electrode, the ion conductor film 7 and the electrode film 8 serving as the upper electrode. The phase change element is configured of the electrode films 8 each serving as the lower electrode, the phase change film 9 and the electrode film 10 serving as the upper electrode. Each of the ion conductor elements becomes an "ON" state (the resistance value at this time is very small) when a current is caused to flow through the ion conductor element by the application of a voltage lower than the forward voltage (Vf) of the silicon pn diode, for example, −0.1 V, to the electrode film 8 serving as the upper electrode. Each of the ion conductor elements becomes an "OFF" state when a current is not caused to flow through the ion conductor element by the application of a positive voltage to the electrode film 8 serving as the upper electrode. The state, "0," in which the resistance of the phase change element is high can be set by causing the ion conductor element to become the "ON" state and then by applying the reset voltage Vreset that is a reset pulse signal to the word line WL. The state, "1," in which the resistance of the phase change element is low can be set by causing the ion conductor element to become the "ON" state and then by applying the set voltage Vset that is a set pulse signal to the word line WL.

For this reason, in comparison with the conventional semiconductor memory device using diode characteristics, the semiconductor memory device according to the present embodiment can be operated at a low voltage. Moreover, since the semiconductor memory device according to the present embodiment does not use a silicon pn diode, the heat treatment of substantially not less than 750° C. for activating the P layer or the N layer is no longer required. Thus, a semiconductor memory device using diode characteristics can be manufactured at a relatively low temperature.

The present invention is not limited to the aforementioned embodiments. Various modifications can be made without departing from the sprit and the scope of the invention.

For example, although the resistance change element and the ion conductor element are connected in this order in a cascade arrangement in the direction from the bit to word lines between these lines in the present embodiments, the order of the connection of the resistance change element and the ion conductor element may be changed. In other words, the ion conductor element and the resistance element are connected in this order in a cascade arrangement.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   first and second wirings arranged in a matrix; and
   a memory cell being provided at an intersecting point of the first and second wirings and including a resistance change element and a diode having an ion conductor element connected to each other in a cascade arrangement between the first and second wirings.

2. The semiconductor memory device according to claim 1, wherein the first wiring is a bit line and the second wiring is a word line.

3. The semiconductor memory device according to claim 1, wherein the ion conductor element is made of ion conductor solid electrolyte containing any one of sulfide metal, silver iodide, 3d or 4d transition metal chalcogenide and 3d or 4d transition metal halogen.

4. The semiconductor memory device according to claim 1, wherein the resistance change film constituting the resistance change element is a phase change film containing any one of GeSbTe, AsSbTe, SeAsTe, and an admixture obtained by adding, to one of these substances, any one of oxygen, nitride and silicon.

5. A semiconductor memory device comprising:
   bit lines and word lines arranged in a matrix; and
   a memory cell being provided at an intersecting point of one of the bit lines and one of the word lines and including a resistance change element and a diode having an ion conductor element connected to each other in a cascade arrangement between the bit line and the word line, wherein, the diode is formed of a first electrode film, an ion conductor film and a second electrode film in a superposed manner, and the resistance change element is formed of the second electrode film, a phase change film and a third electrode film in a superposed manner.

6. The semiconductor memory device according to claim 5, wherein the second electrode film is made of any one of platinum, nitride titanium, nitride titanium aluminum, nitride titanium silicon, nitride tantalum aluminum and nitride tantalum silicon.

7. The semiconductor memory device according to claim 5, wherein the third electrode film is made of any one of nitride titanium, nitride titanium aluminum, nitride titanium silicon, nitride tantalum aluminum and nitride tantalum silicon.

* * * * *